United States Patent
Reynolds et al.

[11] Patent Number: 6,090,237
[45] Date of Patent: Jul. 18, 2000

[54] APPARATUS FOR RESTRAINING ADHESIVE OVERFLOW IN A MULTILAYER SUBSTRATE ASSEMBLY DURING LAMINATION

[76] Inventors: Carl V. Reynolds, 1112 Amble Dr., Arden Hills, Minn. 55112-5713; Alex M. Neussendorfer, 6711 Vincent Ave. South, Minneapolis, Minn. 55423; Jeffrey K. Kennedy, 2800 Hilldale Ave. NE., St. Anthony, Minn. 55418

[21] Appl. No.: 09/013,246

[22] Filed: Jan. 26, 1998

Related U.S. Application Data

[62] Division of application No. 08/760,107, Dec. 3, 1996, abandoned.

[51] Int. Cl.⁷ .................................................. B32B 31/20
[52] U.S. Cl. .......................... 156/323; 156/89.19; 29/848
[58] Field of Search ........................... 438/15; 156/89.18, 156/89.19, 89.21, 323; 29/848, 830

[56] References Cited

U.S. PATENT DOCUMENTS

| | | | |
|---|---|---|---|
| 3,583,561 | 6/1971 | Wiesler et al. ............................ | 438/15 |
| 4,249,977 | 2/1981 | Bartholomew ........................... | 156/288 |
| 4,513,355 | 4/1985 | Schroeder et al. ...................... | 361/403 |
| 4,618,879 | 10/1986 | Mizukoshi et al. ....................... | 357/74 |
| 4,636,275 | 1/1987 | Norell ..................................... | 156/289 |
| 4,643,935 | 2/1987 | McNeal et al. .......................... | 428/157 |
| 4,680,075 | 7/1987 | McNeal et al. .......................... | 156/289 |
| 5,080,742 | 1/1992 | Takahashi ................................ | 156/212 |
| 5,091,772 | 2/1992 | Kohara et al. ............................ | 357/74 |
| 5,116,440 | 5/1992 | Takeguchi et al. ....................... | 156/90 |
| 5,221,858 | 6/1993 | Higgins, III ............................. | 257/666 |
| 5,468,999 | 11/1995 | Lin et al. .................................. | 257/784 |
| 5,478,420 | 12/1995 | Gauci et al. .............................. | 156/89 |
| 5,538,582 | 7/1996 | Natarajan et al. ....................... | 156/89 |
| 5,573,622 | 11/1996 | Hass et al. ................................ | 156/289 |
| 5,676,788 | 10/1997 | Natarajan et al. ....................... | 156/285 |
| 5,759,320 | 6/1998 | Natarajan et al. ....................... | 156/89 |
| 5,784,782 | 7/1998 | Boyko et al. ............................. | 29/848 |

*Primary Examiner*—Kevin M. Picardat
*Attorney, Agent, or Firm*—Curtis B. Brueske

[57] ABSTRACT

Resin overflow in the interior cavity of a multilayer substrate assembly during lamination is restricted and controlled by a plug inserted into the cavity prior to bonding. The plug is shaped to mate with the stepped vertical profile of the cavity. The plug may include sections of materials of different hardness to support the stepped vertical profile of the plug and to facilitate removal of the plug after lamination. The plug may also include textured surfaces to facilitate removal of the plug. Pressurized gas is introduced at the interface between the plug and the cavity surface to dislodge the plug and a vacuum may be applied to the top of the plug to facilitate removal. The cavity may also be coated with layer of photo sensitive material to protect the metal bonding surfaces in the cavity from damage by the plug and to prevent particulate contamination during lamination.

13 Claims, 12 Drawing Sheets

APPARATUS FOR RESTRAINING ADHESIVE OVERFLOW IN A MULTILAYER SUBSTRATE ASSEMBLY DURING LAMINATION

CROSS REFERENCE TO RELATED APPLICATION

This application is a division of application Ser. No. 08/760,107, filed Dec. 3, 1996 now abandoned.

FIELD OF THE INVENTION

The invention relates generally to packages for semiconductor devices, and more particularly to a method of making a multilayer substrate suitable for such packages.

BACKGROUND OF THE INVENTION

Many high performance semiconductor packages incorporate a multilayer substrate, with an interior cavity, for interconnection with a semiconductor device. The semiconductor device is located within the interior cavity where it is electrically connected to each of a plurality of wiring layers in the multilayer substrate. Each wiring layer comprises a fiberglass laminate bonded on either side to a layer of metal, e.g., copper, defining an interconnection circuitry pattern. The interior cavity has a stepped vertical profile and each step, or bonding tier, includes bonding surfaces, or bond pads, for accepting wire bond connections from the semiconductor device.

A multilayer substrate may be produced by laminating, i.e., bonding, an assembly comprised of several wiring layers, each layer having a differently sized interior cavity or window, stacked so that the assembly has an interior cavity with a stepped vertical profile. One or more layers of adhesive, usually in the form of a sheet of woven material coated with a partially cured epoxy resin, or "pre preg," are interposed between adjacent wiring layers and bond the layers together during lamination.

One problem associated with producing such a multilayer substrate is adhesive overflow during lamination. The high temperatures and pressures of the lamination process cause the adhesive to flow from between the wiring layers onto the bonding tiers in the interior cavity. This decreases the available wire bonding surface of the bonding tiers and requires the semiconductor package manufacturers to increase the width of the bonding tiers, which in turn increases the requisite wire bond length from the semiconductor device to the bond pads. As wire bond length is inversely proportional to signal speed in the package, increasing wire bond lengths reduces signal speeds in the package. Additionally, the overall size of the resultant semiconductor package must be increased to accommodate the wider bonding tiers.

One solution proposed is to prevent adhesive overflow onto the bonding tiers by coating the adjacent surfaces of two wiring layers in the lamination assembly with a layer of epoxy resin prior to lamination. In this manner, a thinner sheet of pre preg may be used between adjacent wiring layers and the edge of the sheet may be recessed from the edge of the larger interior window of the upper wiring layer with the pre-coated epoxy resin providing adhesive material at that edge.

However, such methods require two additional processing steps as the epoxy resin must first be printed on the surfaces of the wiring layers and then cured. Also, introducing an additional material, i.e., the epoxy resin, into the lamination assembly increases the potential for cracking due to differences in the rates (coefficients) of thermal expansion among the several materials in the assembly.

Another problem associated with adhesive overflow is that the surface of the overflow adhesive on the bonding tiers tends to be rough, including cavities that may trap chemicals or moisture during subsequent processing steps and ruin the package.

Yet another problem that may be encountered in the manufacture of a high performance semiconductor package that includes a multilayer substrate is adhesion at the non-essential metal surfaces in the cavity, i.e., those metal surfaces not required for wire bonding. For example, the interior cavity of the multilayer substrate, which houses the semiconductor device, may be encapsulated for environmental protection using a liquid epoxy resin or other components may be bonded onto the cavity surface using polymer adhesives. These adhesives or encapsulants usually have a low bonding affinity for metal, e.g., the metal surfaces on the vertical edges of the wiring layers.

A further problem associated with lamination of the multilayer substrate is contamination of the metallic bonding surfaces by "resin dust." Resin dust refers to particles and fibers which dislodge from the fiberglass laminates in the wiring and adhesive layers and migrate throughout the assembly during lamination. This resin dust may adhere to the bond pads, decreasing the integrity of the ultimate electrical connection between the wire bonds on the semiconductor device and the bond pads on the package.

One solution to this problem is to attempt a "powder-free" process in which the fiberglass laminates in the wiring and adhesive layers are further cured to bond any loose particles or fibers onto the wiring and adhesive layers, thereby preventing them from dislodging and migrating during lamination. However, this curing process requires an extra heating step which may be undesirable in some manufacturing processes.

The present invention provides a way to reduce adhesive overflow onto the bonding tiers of a multilayer substrate during lamination without introducing additional materials into the substrate.

The invention also provides a smooth or micro patterned surface to adhesive exposed in the cavity of the multilayer substrate.

In addition, the invention reduces resin dust contamination of the bond pads in the cavity of the multilayer substrate during lamination.

SUMMARY OF THE INVENTION:

According to the present invention, the flow of adhesive in a multilayer assembly is restrained during lamination, i.e., bonding. More particularly, the flow of adhesive is restrained by inserting a plug into the interior cavity having a shape configured to mate with the stepped profile of the interior cavity. Preferably, the plug is made of an elastomeric material.

Advantageously, the plug is sized to provide a limited space between the plug and the wiring layers to permit adhesive to flow into and fill the space between the plug and the vertical edges of respective wiring layers. In this manner, the adhesive conforms to the shape defined by the space, thereby coating the metal surface on the vertical edges of the wiring layers without coating the portions of the wiring layer which should remain uncoated.

In a preferred embodiment, the plug includes a layer of a material harder than the material of the plug in contact with the stepped profile of the interior cavity to facilitate removal of the plug without damaging the wire bonding sites on the surfaces of the wiring layers exposed in the cavity. The metallic bonding surface of the multilayer substrate assembly is advantageously coated with a layer of a photo sensitive material prior to lamination to protect the metallic bonding surfaces of the interior cavity from damage due to pressure exerted by the plug during lamination. The photo sensitive layer also prevents contamination of the metallic bonding surfaces due to particulate migration during lamination.

BRIEF DESCRIPTION OF THE DRAWINGS

The foregoing and other features of the invention will become apparent in the following detailed description of a presently preferred embodiment taken in conjunction with the accompanying drawings, wherein.

DETAILED DESCRIPTION

Figure 1:
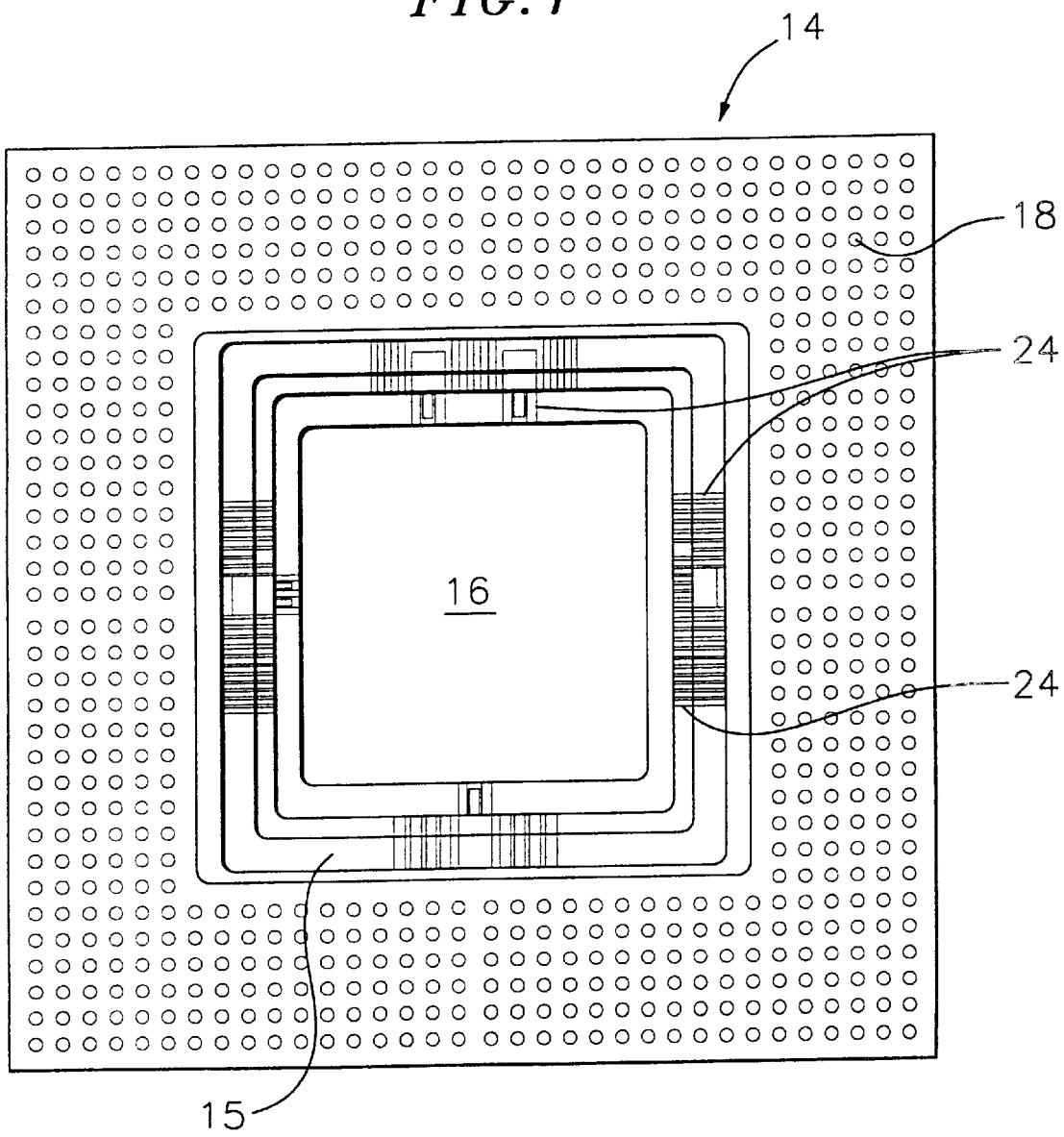
FIG. 1 is a top view of a high performance ball grid array ("BGA") semiconductor device package including a multilayer substrate with an interior cavity.
Figure 2:
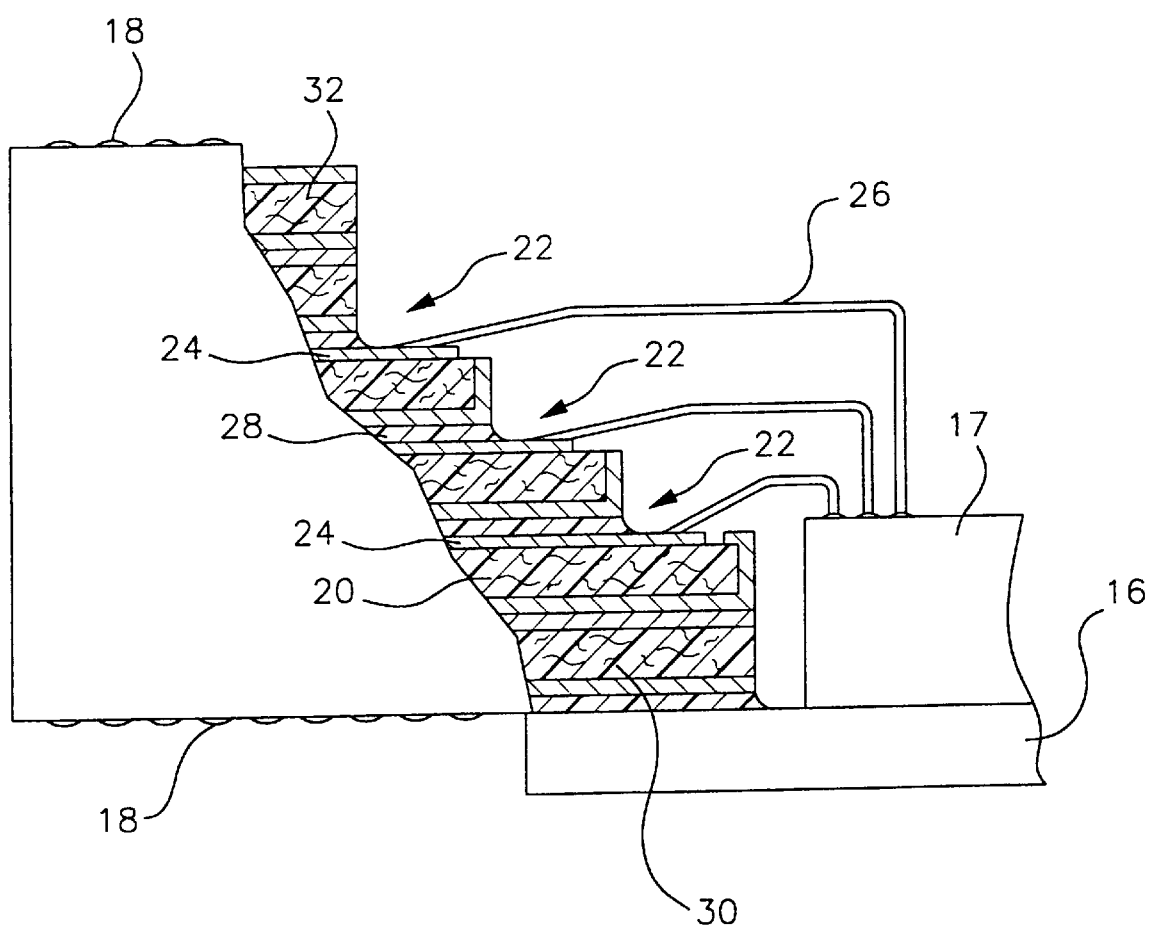
FIG. 2 is a partial cross-sectional view of the BGA package.

FIG. 1 illustrates a ball grid array ("BGA") semiconductor package 14, an example of one type of single chip semiconductor package which includes a multilayer substrate 15. Such multilayer substrates are also used in multichip modules as well as other single chip packages. The multilayer substrate includes an interior cavity having a stepped vertical profile and is mounted in the BGA package to a metal plate 16, or heat slug, to which a semiconductor device 17 is mounted, as shown in FIG. 2. The heat slug provides a mounting surface for the semiconductor device in the interior cavity and also acts as a heat sink to dissipate heat generated by the device during operation. An array of solder balls 18 is provided on the exterior surface of the package to accommodate electrical interconnection with other devices.

The multilayer substrate consists of a plurality, i.e., two or more, stacked wiring layers 20, each wiring layer including a window portion. Each wiring layer comprises a fiberglass laminate bonded on either side to a layer of metal, e.g., copper, defining an interconnection circuitry pattern. The interior cavity of the assembly is formed by stacking wiring layers with increasingly larger window portions. Each wiring layer has a step portion 22 exposed in the cavity, the bonding tier, or step, which includes bond pads 24 for wire bonding. Wire bonds 26 are attached at one end to the leads on semiconductor device 17 and to corresponding bond pads 24 at the other end to interconnect the device and the package. Each bond pad is in turn electrically connected to another bond pad or to one corresponding solder ball on the exterior of the BGA package. In this manner, the multilayer substrate enables the interconnection of one semiconductor device to several wiring levels, providing the high interconnection density and control of electrical characteristics required for high performance applications.

The multilayer substrate is formed by laminating an assembly comprising several stacked wiring layers with a layer of adhesive 28, e.g., a film of a partially cured epoxy or cyanate ester resin, or "pre preg," interposed between adjacent wiring layers during lamination. The adhesive layer may also be a sheet of woven material coated with a pre preg resin. The edge of the adhesive layer may be flush with the edge of the window portion of the upper wiring layer (see FIG. 5) or slightly recessed. The stacked wiring layers are sandwiched between a first lamination layer 30 and a second lamination layer 32. Preferably, these layers each comprise a fiberglass laminate having an outer side 33, 34 coated with a layer of copper foil and an inner side 35, 36 adjacent a wiring layer. A layer of adhesive is interposed between the inner sides of the lamination layers and the adjacent wiring layers. The heat and pressure of the lamination process cause the adhesive to melt and flow between adjacent layers and then cure and bond the layers together into a multilayer structure. Following lamination, portions of first lamination layer 30 and second lamination layer 32 are routed or otherwise removed to expose the interior cavity of the multilayer substrate. The lamination layers may also be rigid sheets, e.g., of copper or polymeric material, coated with a layer of elastomeric material directly contacting the outer wiring layers of the multilayer assembly, which are completely removed after lamination.

Figure 3:
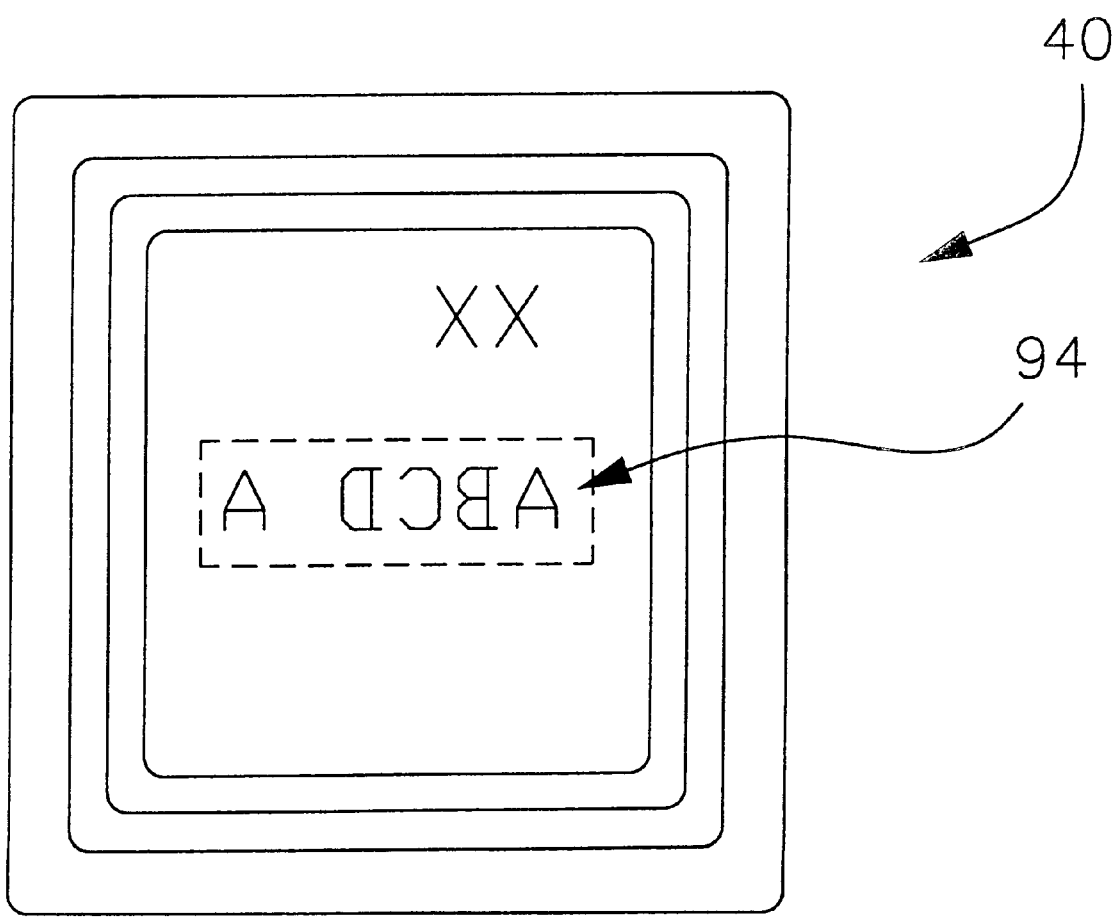
FIG. 3 is a bottom view of the plug.
Figure 4:
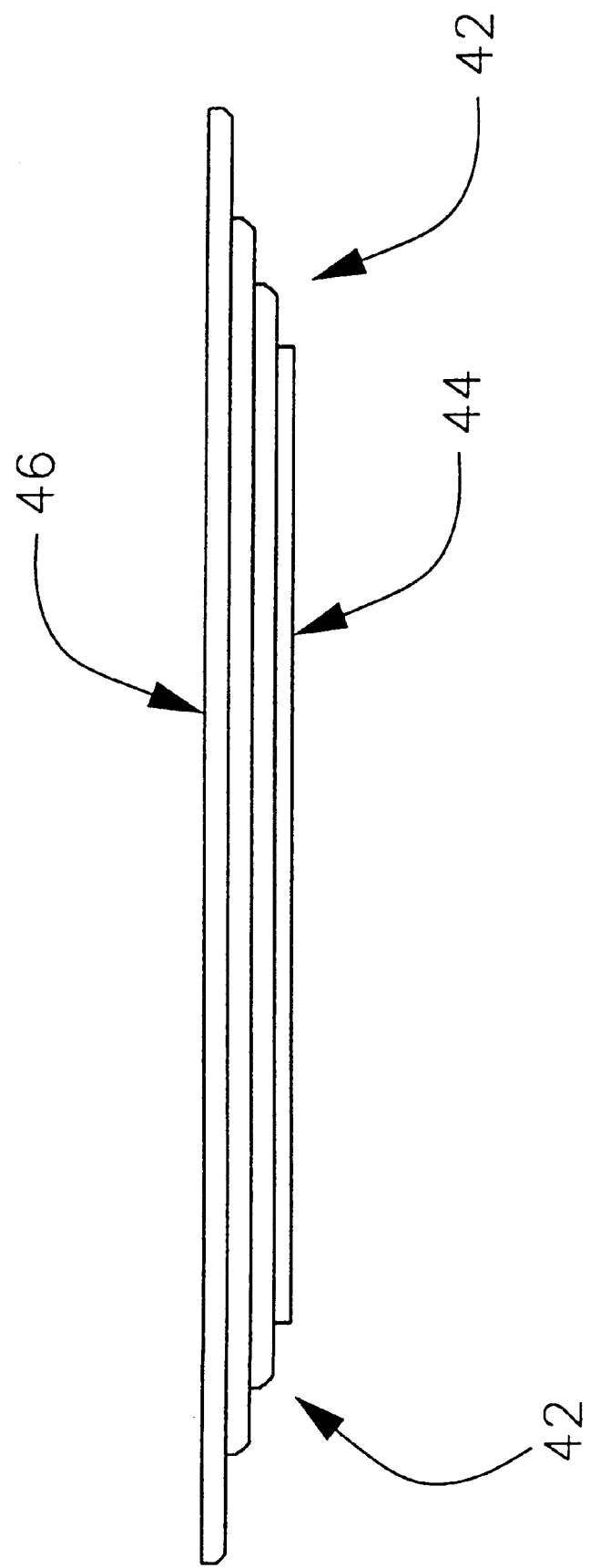
FIG. 4 is a side view of the plug.

FIG. 3 illustrates a plug 40 provided to restrain the flow of adhesive in the interior cavity of a multilayer substrate during lamination. In a preferred embodiment, the plug is formed entirely of an elastomeric material, e.g., silicone, having a preferred hardness of 60 to 70 durometers. The plug includes a stepped vertical profile 42, as shown in FIG. 4, shaped to mate, i.e., conform, with the stepped vertical profile of the interior cavity of the multilayer substrate. In addition to stepped vertical profile 42, the plug includes a bottom surface 44 and a top surface 46.

Figure 5:
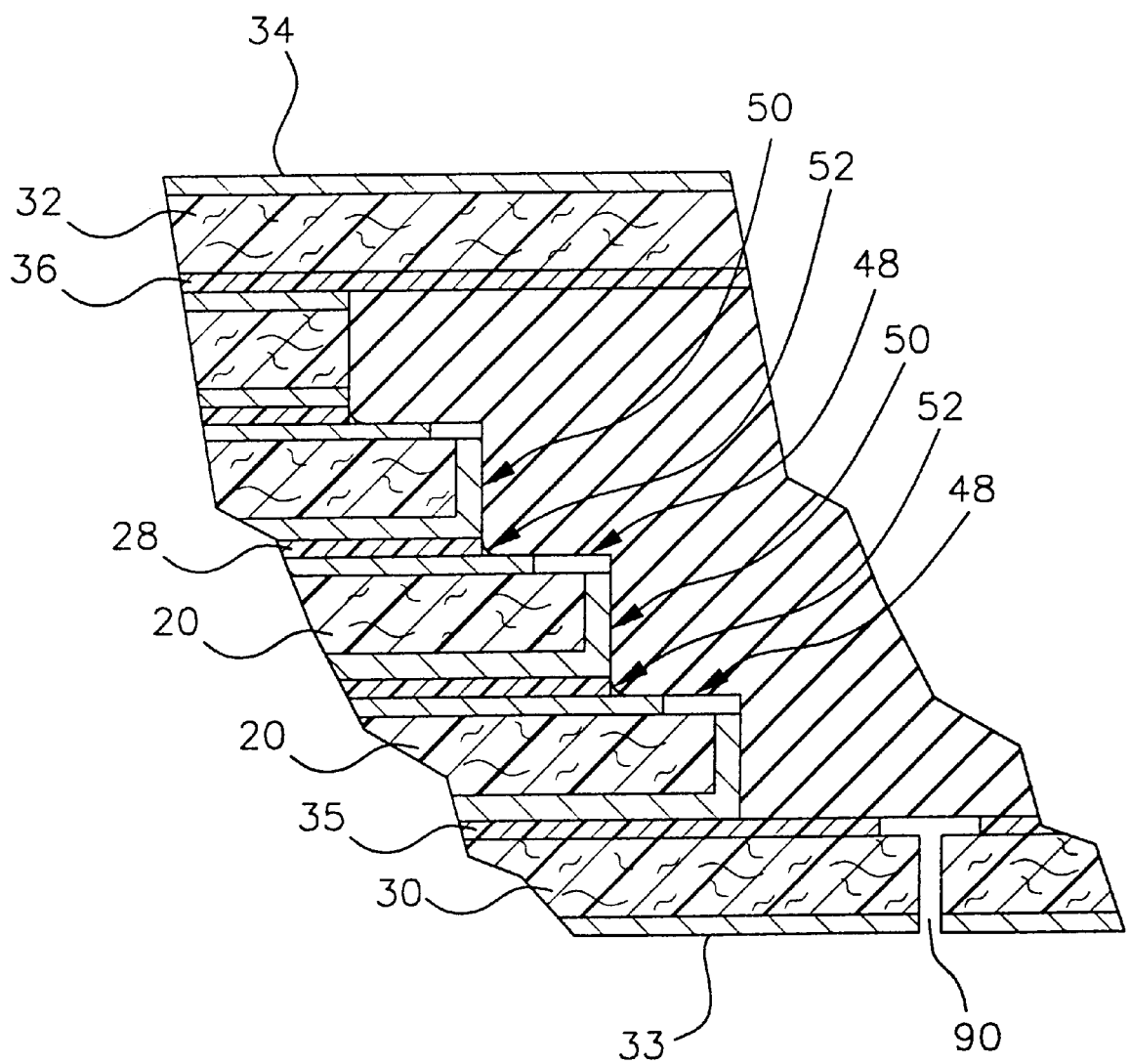
FIG. 5 is a partial cross-sectional view of the plug placed in the interior cavity of the lamination assembly.

FIG. 5 shows a partial cross-sectional view of the plug in mating position with the interior cavity of the multilayer substrate prior to lamination. Each step of the vertical profile of the plug includes a horizontal face 48 adjacent a horizontal surface of a bonding tier, a vertical edge 50 adjacent a vertical edge of a bonding tier and a corner 52 placed adjacent an adhesive layer 28 between two wiring layers 20 in the lamination assembly. The corners may have curved or chamfered surfaces (see FIGS. 5, 7 and 9).

Adhesive flowing from between the wiring layers onto bonding tiers 22 in the interior cavity of the multilayer substrate effectively decreases the bondable metal surface of each bond pad on the bonding tier. Accordingly, it is desirable to build in tolerances for such adhesive overflow by increasing the width of each bonding tier in the multilayer substrate. By reducing adhesive overflow according to the invention, the width of each bonding tier can be reduced. This reduces the requisite length of wire bonds between the semiconductor device and the bond pads in the cavity of the multilayer substrate. As signal speed is inversely proportional to wire bond lengths, reducing wire bond lengths advantageously increases signal speeds in, and overall performance of the package. Also, adhesive material on the bonding tiers 22 resulting from adhesive overflow during lamination tends to have a rough surface which may capture chemicals and moisture during subsequent processing steps, ruining the semiconductor package.

Figure 6:
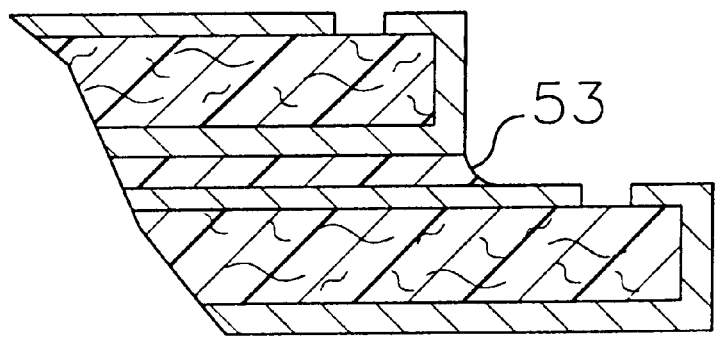
FIG. 6 is a partial cross-sectional view of the meniscus formed between wiring layers by one version of the plug.

Plug 40 advantageously restricts adhesive flowing from between the wiring layers onto bonding tiers 22 and molds it into a desired shape. During lamination, adhesive overflow is restricted by the stepped vertical profile of the plug, including at corners 52. As the adhesive flows from between the layers, it conforms to the shape of the space between the wiring layers and the plug, resulting in a bead of adhesive material 54 having a convex surface, or meniscus, at the junction between adjacent layers in the resultant multilayer substrate, as shown in FIG. 6. The topography of the adhesive material exposed in the cavity conforms to the topography of the plug surface, and may be smooth or micro patterned.

Controlled adhesive overflow onto the vertical or horizontal surfaces of the interior layer may be desirable in some applications. For example, it may be desirable to bond other components onto the cavity surface of the BGA using polymer adhesives or to encapsulate the semiconductor device in the cavity with an encapsulant ("glob top"), e.g., liquid epoxy, for environmental protection or performance and reliability enhancement of the semiconductor device and package. These adhesives have a low bonding affinity for metal surfaces and may make it desirable to minimize nonessential metal surfaces in the cavity, in particular, the metal surfaces on the vertical edges of the wiring layer which are not used for wire bonding. Directing adhesive overflow onto these surfaces reduces the area of exposed metal surfaces in the cavity. This may be accomplished according to one embodiment of the invention shown in FIG. 7. The stepped vertical profile of the plug has a vertical edge including a surface 55 that contacts the vertical edge of the adjacent wiring layer and a recessed portion 56 adjacent to one of the corners. During lamination, adhesive flows between the wiring layer and is restricted by corner 52. The adhesive then flows into recessed portion 56, covering a portion of vertical edge of the adjacent wiring layer, and is then restricted by a bottom shelf 57 of contact portion 55. The exposed metal surface area on the vertical edges of the resultant multilayer substrate is thereby minimized, as shown in FIG. 8A, providing an improved surface for accommodating an encapsulant and/or other polymer adhesives. Recessed portion 56 may also be made flush with the horizontal face of the step 22, which allows adhesive to coat the entire vertical edge of the adjacent wiring layer. The plug may also be shaped to allow adhesive flow to extend slightly onto the horizontal face of the wiring layer, resulting in an adhesive layer wrapped slightly over the edge of the wiring layer, as shown in FIG. 8B. Extending the adhesive up to or over the vertical edge of the wiring layers in this manner also makes it easier to visually verify the formation of a good meniscus at the junctions between the wiring layers.

Figure 7:
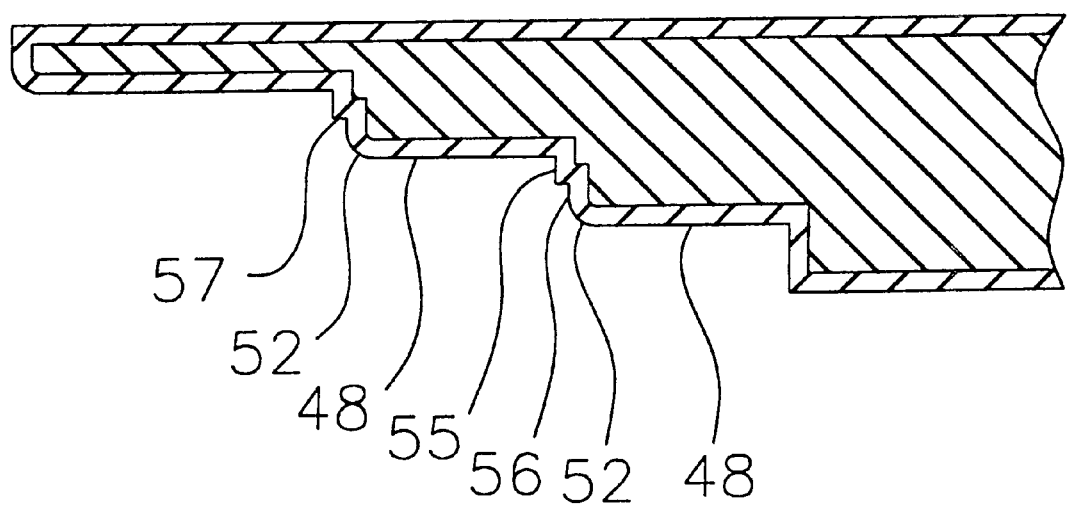
FIG. 7 is a partial cross-sectional view depicting another embodiment of the plug.
Figure 8A:
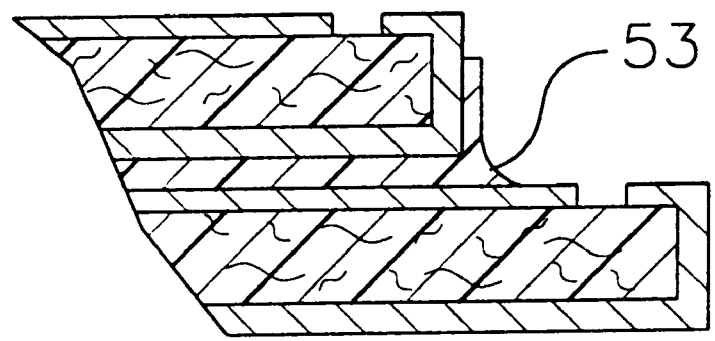
FIG. 8A is a partial cross-sectional view of the meniscus formed between wiring layers by another version of the plug.
Figure 8B:
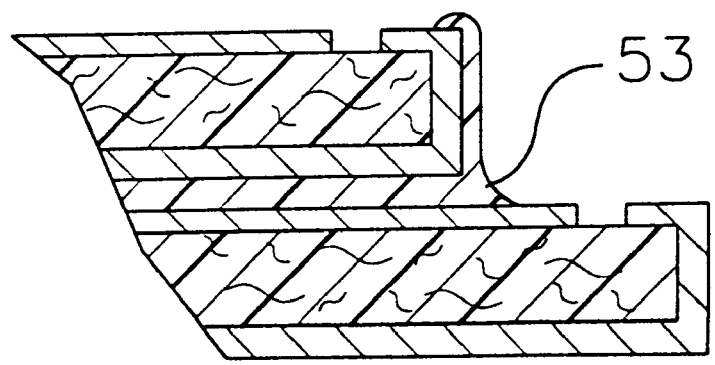
FIG. 8B is a view similar to FIG. 8A, but depicting the meniscus formed between wiring layers by yet another version of the plug.

FIG. 7 also illustrates a further embodiment of the plug which includes a core 58 of a relatively hard material, e.g., aluminum, steel or a hard polymer, surrounded by a layer of silicone 60 with a hardness in the preferred range of 40 to 80 durometers at the stepped vertical profile. The hard core offers increased support to the stepped vertical profile of the plug for restricting adhesive flow during lamination. The appropriate durometer of silicone layer 60 depends on the degree of hardness of the core.

After lamination, the plug is removed from the cavity. The adhesive tends to adhere the plug to the cavity. The degree of adhesion is related to the surface area of the plug contacting the lamination assembly. Soft surfaces on the plug tend to deform due to the pressures experienced by the plug during lamination and will consequently have more surface area contacting the lamination assembly than an equivalently shaped hard surface. It is therefore desirable to have hard surfaces contacting most of the surface of the lamination assembly, but not at the bond pads which may be damaged by such an unyielding surface during lamination.

Figure 9:
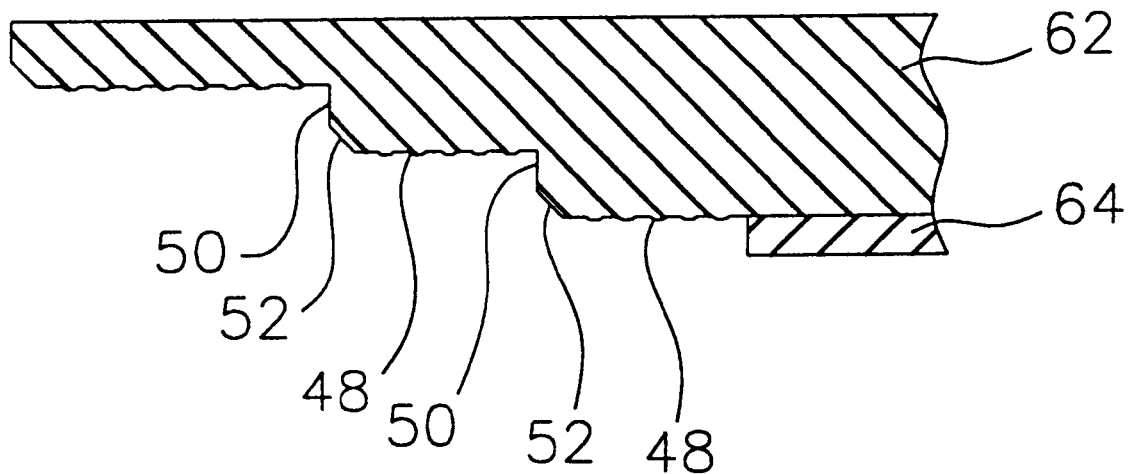
FIG. 9 is a view similar to FIG. 7, but depicting yet another embodiment of the plug.

FIG. 9 illustrates yet another embodiment of the plug according to the invention wherein the material 62 comprising the stepped vertical profile has a preferred hardness of 60 to 70 durometers with a harder material 64 at the bottom surface of the plug. Thus, the bottom surface of the plug surface deforms less due to the high pressure of the lamination process and consequently has a reduced surface area contacting the bottom of the cavity, making the plug easier to remove.

It is advantageous to include textured horizontal faces on the stepped vertical profile of the plug (FIG. 9). This contours the surface area of the horizontal face contacting the lamination assembly which facilitates removal without sacrificing impedance of the adhesive flow as most of the flow is experienced at the corners and vertical edges of the stepped vertical profile of the plug.

Figure 10:
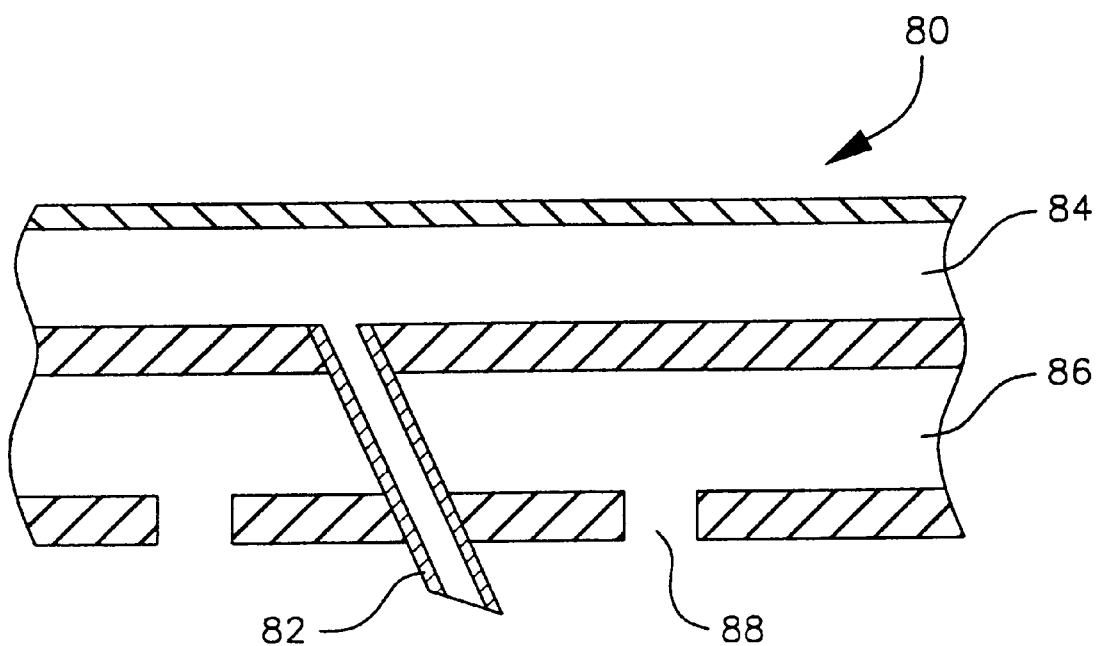
FIG. 10 is a schematic showing a tool for removing the plug.

A convenient way to dislodge the plug for removal after lamination is to introduce pressurized gas between the plug and the cavity surface. This may be accomplished with a removal tool 80, a schematic of which is shown in FIG. 10. The removal tool preferably includes a cannula 82 extending from a chamber 84 attached to a source of pressurized gas (not shown). The cannula is inserted through the plug and onto the cavity surface. Pressurized gas is then introduced through the cannula. After the plug is dislodged, the removal tool retracts the plug from the cavity. Retraction may be facilitated by including a vacuum chamber 86 in the removal tool having associated suction elements 88 for engaging the top surface of the plug. Pressurized gas may also be introduced between the plug and the cavity surface through a hole 90 provided in first lamination layer 30 of the lamination assembly and the adjacent layer of adhesive (see FIG. 5).

Figure 11A:
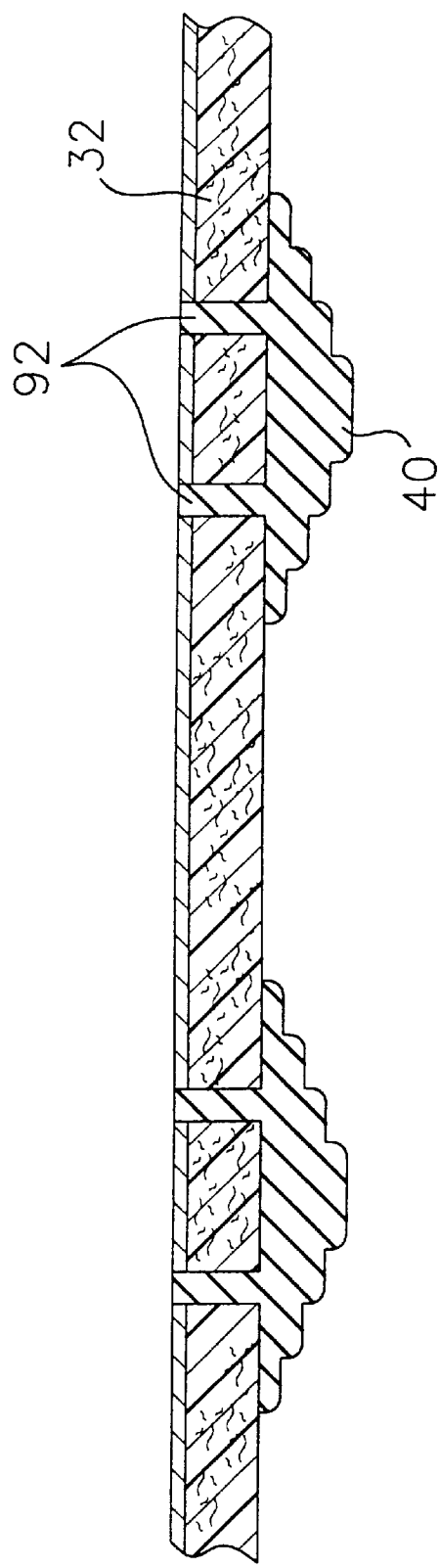
FIG. 11A is a cross-sectional view of a lamination layer having a plurality of attached plugs.
Figure 11B:
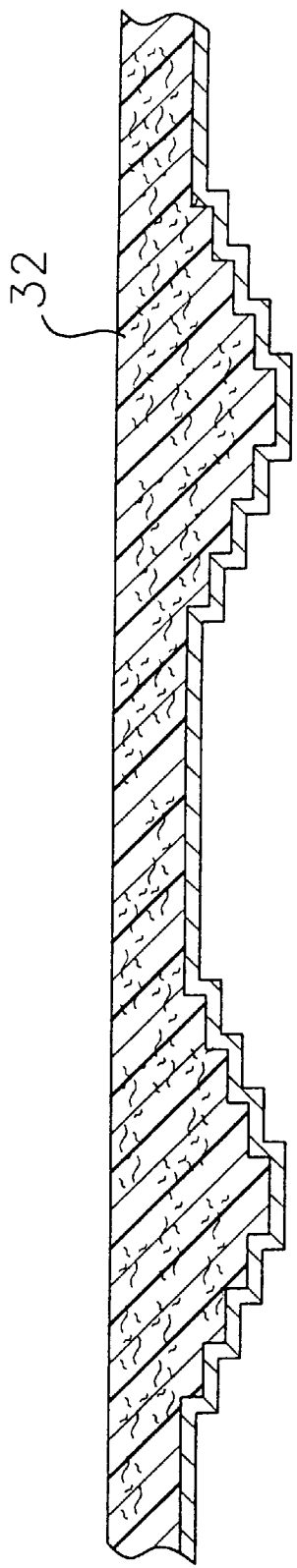
FIG. 11B is a view similar to FIG. 11A, but depicting another version of the lamination layer including a plurality of plugs.

Multilayer structures may be made comprising a plurality of multilayer assemblies that including a plurality of associated interior cavities arranged in rows and columns. According to one embodiment of the invention, second lamination layer 32 includes a plurality of plugs 40 attached on inner side 36 to correspond with the cavities in the assemblies. The plugs may be attached to the second lamination layer with an adhesive or directly molded onto that side, as shown in FIG. 11A. For example, the plugs may be formed by injecting elastomeric material through holes 92 into molds in contact with the inner side of the lamination assembly or directly into the interior cavities. In another embodiment, second lamination layer 32 is formed of a rigid material such as copper or a hard polymer. A plurality of plug shapes 95 are provided on inner side 36 which is coated with a compliant elastomer layer 96 for contacting the cavities in the assemblies, as shown in FIG. 11B. Subsequent to lamination, second lamination layer 32 is removed after lamination and possibly re-used. In a further embodiment, the plug may be used to code (identify) each cavity in a lamination assembly. For example, the silicone of the plug may be color coded and/or an identifier text 94 may be molded into the bottom of the plug (see FIG. 3). The identifier text is molded into the adhesive layer in the bottom of the cavity during lamination, thereby identifying that cavity.

Figure 12:
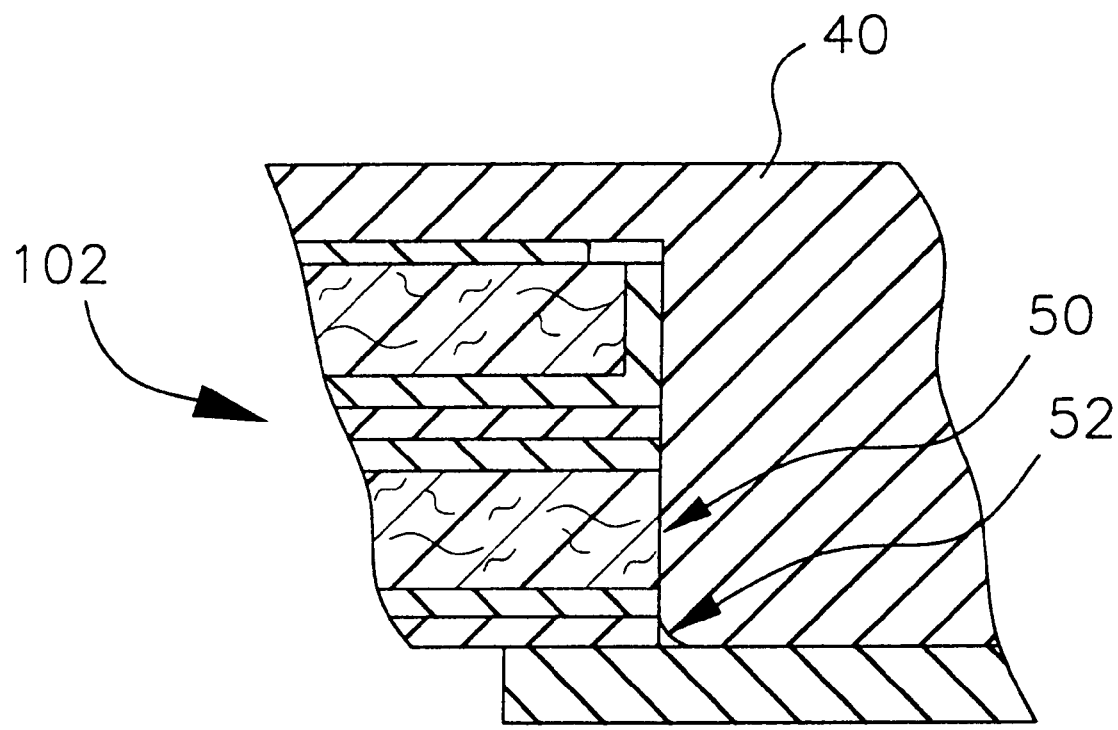
FIG. 12 is a partial cross-sectional view of the plug placed in the interior cavity of a multilayer substrate positioned on the heat slug.

According to yet another embodiment of the invention, the plug may be used to restrain adhesive overflow when bonding a multilayer substrate having an interior window to the heat slug. As shown in FIG. 12, plug 40 has a corner 52 adjacent an adhesive layer 28 interposed between multilayer substrate 102 and heat slug 16. The plug advantageously restricts adhesive overflow onto the surface of the heat slug exposed in the cavity.

Figure 13:
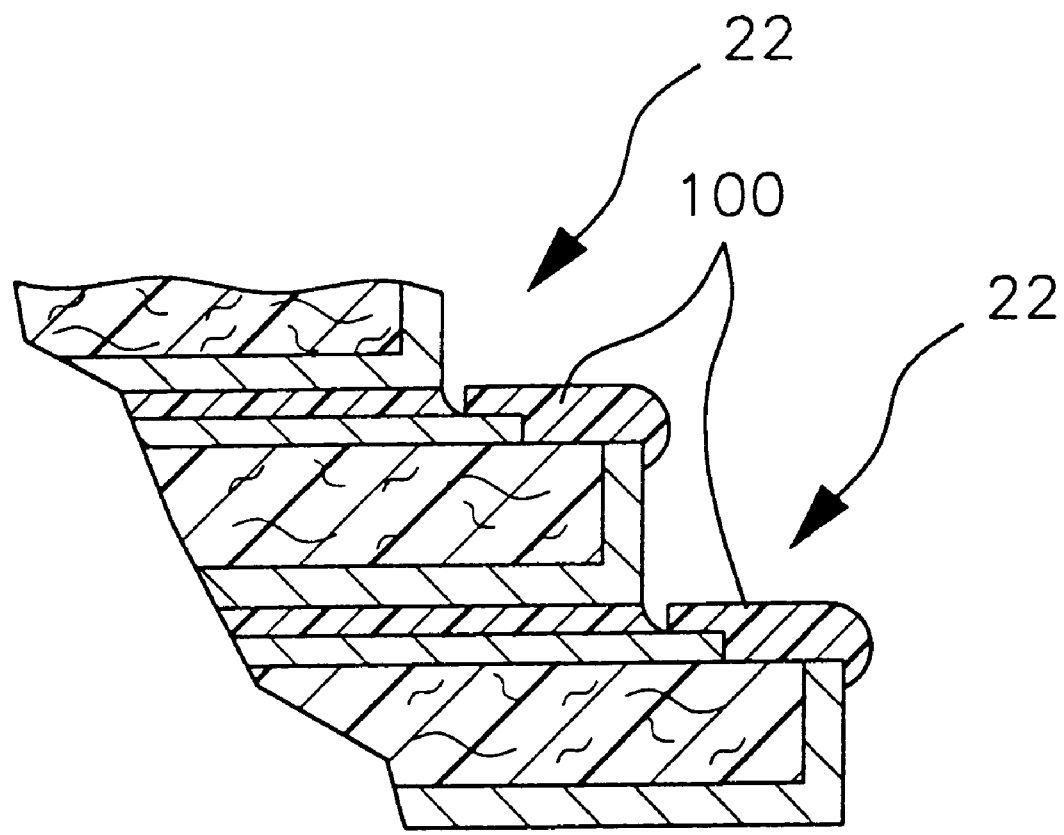
FIG. 13 is a partial cross-sectional view of the interior cavity of the lamination assembly coated with a protective layer of photo sensitive material.

Due to the high pressures which may be involved in lamination, there is a danger that the plug may potentially damage the bond pads in the cavity of the multilayer substrate. One method for protecting these metal surfaces is to coat them prior to lamination with a protective layer of photo sensitive material 100 resistant to the high temperatures involved in lamination (FIG. 13). The protective layer is deposited on the surface of the cavity, and then developed to cover the exposed metal surfaces on the horizontal surfaces of the bonding tiers. This photo sensitive layer protects the bond pads during lamination and is readily removed following lamination.

Protective layer 100 provides an added benefit of preventing particulate contamination during lamination. Each wiring layer comprises a fiberglass laminate which includes particles and fibers which may dislodge during lamination. This "resin dust" migrates through the assembly during lamination and may adhere to the bond pads. Subsequent to lamination of the multilayer substrate, the bond pads in the cavity are plated with one or more layers of metal such as gold or nickel to improve wire bonding. Resin dust contamination on the bond pads may prevent effective plating of the bond pads, thereby ruining the semiconductor package. In a lamination assembly coated with such a protective layer, the resin dust will adhere to the protective layer, preventing particulate contamination of the bond pads. The resin dust is removed from the multilayer substrate along with protective layer 100.

It is apparent from the foregoing that various changes and modifications may be made without departing from the invention. Accordingly, the scope of the invention should be limited only by the appended claims, wherein:

We claim:

1. An elastomeric plug suitable for use in the manufacture of a multilayer substrate, said plug having a stepped vertical profile comprising at least one step and a hardness of between about 40 to 80 durometers.

2. A plug according to claim 1 having a stepped vertical profile comprising a plurality of steps.

3. A plug according to claim 1 wherein the elastomeric material is silicone.

4. A plug according to claim 1 having a hardness between about 60 and 70 durometers.

5. A plug according to claim 1 wherein said plug comprises:

a core comprising a material having a hardness greater than about 80 durometers; and a layer of elastomeric material comprising the stepped vertical profile, said elastomeric material having a hardness between about 40 and 80 durometers.

6. A plug according to claim 1 wherein said plug comprises:

a top layer including the stepped vertical profile and formed of a material having a hardness of about 60 to 70 durometers; and a bottom layer comprising a material having a hardness greater than about 80 durometers.

7. A plug according to claim 1 wherein each step of the stepped vertical profile comprises:

a horizontal face;

a vertical edge; and and a corner located between the horizontal face and the vertical edge.

8. A plug according to claim 7 wherein the horizontal face comprises a textured surface.

9. A plug according to claim 7 wherein the vertical edge comprises a recessed portion adjacent the corner.

10. A plug according to claim 7 wherein the corner has a curved surface.

11. A plug according to claim 7 wherein the corner has a chamfered surface.

12. A plug according to claim 1 wherein said plug comprises a bottom surface including an identification text adapted to be molded into a layer of adhesive contacting said bottom surface.

13. A plug according to claim 1 wherein the elastomeric material is color coded.

* * * * *